(12) United States Patent  
Mazza et al.

(10) Patent No.: US 7,282,934 B2  
(45) Date of Patent: Oct. 16, 2007

(54) FLEXIBLE MICROCIRCUIT SPACE TRANSFORMER ASSEMBLY

(75) Inventors: Dean C. Mazza, Middlebury, CT (US); Salvatore Sanzari, Naugatuck, CT (US); Jeff P. Ritell, Ridgefield, CT (US); Francis T. McQuade, Watertown, CT (US)

(73) Assignee: Wentworth Laboratories, Inc., Brookfield, CT (US)

( * ) Notice: Subject to any disclaimer, the term of this patent is extended or adjusted under 35 U.S.C. 154(b) by 428 days.

(21) Appl. No.: 11/077,537

(22) Filed: Mar. 9, 2005

(65) Prior Publication Data

US 2005/0218429 A1    Oct. 6, 2005

Related U.S. Application Data

(60) Provisional application No. 60/551,990, filed on Mar. 10, 2004.

(51) Int. Cl.  
*G01R 31/02* (2006.01)

(52) U.S. Cl. .................. 324/754; 324/758; 324/755

(58) Field of Classification Search ........ 423/754–758, 423/761; 336/200, 223, 232  
See application file for complete search history.

(56) References Cited

U.S. PATENT DOCUMENTS

| 4,954,878 | A | * | 9/1990 | Fox et al. ................... 257/675 |
| 5,399,982 | A | * | 3/1995 | Driller et al. ................ 324/754 |
| 6,050,829 | A | | 4/2000 | Eldridge et al. ............... 439/67 |
| 6,274,823 | B1 | * | 8/2001 | Khandros et al. ........... 174/261 |
| 6,566,898 | B2 | | 5/2003 | Theissen et al. ............ 324/754 |
| 6,661,244 | B2 | | 12/2003 | McQuade et al. .......... 324/754 |
| 6,762,612 | B2 | * | 7/2004 | Yu et al. ..................... 324/757 |
| 6,924,654 | B2 | * | 8/2005 | Karavakis et al. .......... 324/754 |
| 2004/0124829 | A1 | * | 7/2004 | Swettlen et al. ......... 324/158.1 |

\* cited by examiner

*Primary Examiner*—Anh Mai  
(74) *Attorney, Agent, or Firm*—Wiggin and Dana LLP; Anthony P. Gangemi; Gregory S. Rosenblatt (57) ABSTRACT

A space transformer for electrically interconnecting a probe head to a printed circuit board, which includes a flexible multilayer circuit with device under test contact pads formed on a first side and printed circuit board contact pads formed on a second side. Electrically conductive circuit traces extend between the device under test contact pads and the printed circuit board contact pads. A shim plate is fastened to a periphery of the first side of the flexible multilayer circuit and a bottom plate is fastened to a periphery of the second side of the flexible multilayer circuit. The bottom plate has a plurality of internal apertures are aligned with the printed circuit board contact pads separated by bottom plate stanchions that are aligned with the device under test contact pads. A plurality of interconnects are bonded and electrically interconnected to the printed circuit contact pads and extend through the internal apertures.

14 Claims, 7 Drawing Sheets

FLEXIBLE MICROCIRCUIT SPACE TRANSFORMER ASSEMBLY

CROSS REFERENCE TO RELATED APPLICATION(S)

This patent application claims benefit under 35 U.S.C. §119(e) of copending, U.S. Provisional Patent Application Ser. No. 60/551,990, filed Mar. 10, 2004, the disclosure of which is incorporated by reference herein in its entirety.

BACKGROUND OF THE INVENTION

1. Field of the Invention

This invention relates to equipment to test the electrical properties of integrated circuits. More particularly, the invention relates to a space transformer that is positioned between a test probe head and a printed circuit board in a vertical pin probing device.

2. Description of the Related Art

Integrated circuits are typically formed as a plurality of chips having circuit traces and other features formed by photolithography on a surface of a silicon or gallium arsenide wafer. The chips are then singulated and encased within an electronic package for use in a wide range of applications. Since the electronic package is frequently contained within an expensive piece of equipment, it is desirable to verify the electrical properties of the circuit traces prior to singulation. The circuit traces are electrically tested for electrical properties such as continuity and short circuits. As disclosed in U.S. Pat. No. 6,661,244, which is incorporated by reference in its entirety herein, one method of testing the integrated circuit is with a vertical pin probing device.

Figure 13:
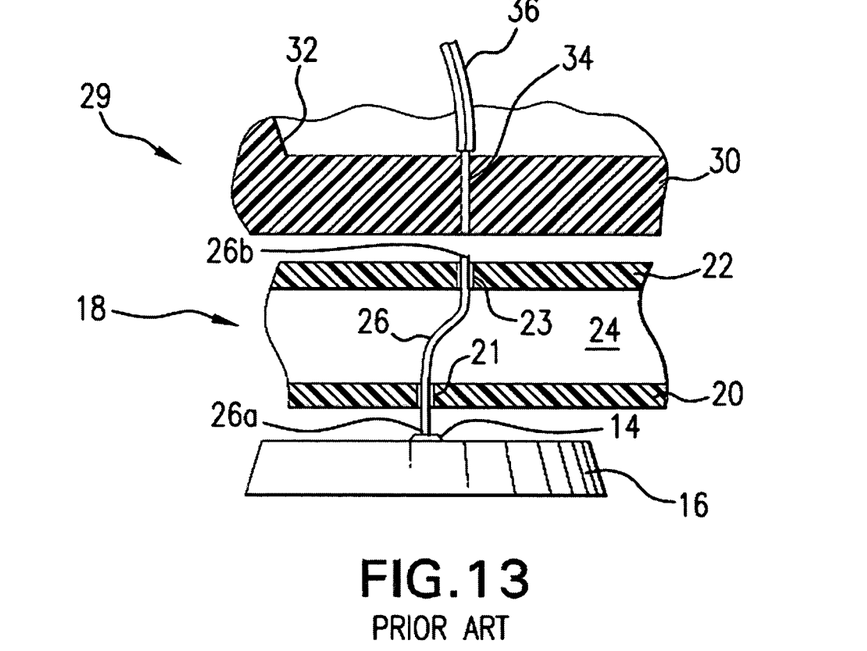
FIG. 13 shows a probe head assembly for use in a vertical pin probing device as known form the prior art.

A portion of a vertical pin probing device as known from the prior art is illustrated in FIG. 13. A device under test 14, typically an integrated circuit, is supported by a movable chuck 16. The device under test 14 is positioned under a vertical pin integrated circuit probe at assembly 18, which includes a first die 20 having a first array of holes 21 spaced from a second die 22 having a second array of holes 23. A spacer 24 separates the first die 20 from the second die 22. Probe pins 26 extend through both the first array of holes 21 and the second array of holes 23. A probe tip end 26a contacts a portion of the device under test 14 while an opposing second end 26b of the probe pin extends outward from the second array of holes 23. The first array of holes 21 and second array of holes 23 are slightly offset from one another and the probe pins are curved in a snake-like configuration to promote buckling so as to create a substantially uniform contact pressure on the integrated circuit device under test 14 despite any slight vertical unevenness or misalignment.

The prior art space transformer 29, partially illustrated in FIG. 13, includes a mounting block 30 with a third array of holes 34 that align with the second end 26b of the probe pin 26. A wire 36 extends into the third array of holes 34 to make electrical contact with the second end 26b of probe pin 26.

Figure 14:
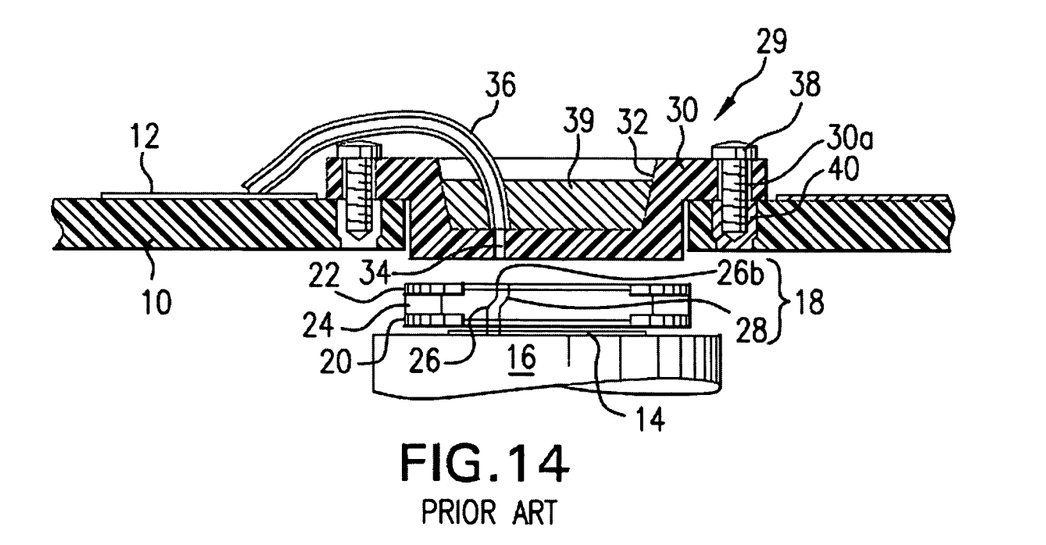
FIG. 14 shows a space transformer electrically interconnected to the probe head assembly of FIG. 13 as known from the prior art.

With reference to FIG. 14, the wire 36 is fixedly held in place in a well 32 of the mounting block 30 by an epoxy potting compound 39. The well 32 is fastened 38 to a printed circuit board 10 having conductive traces 12 formed on at least one surface. The wires 36 are soldered to the conductive traces 12 providing electrical interconnection to the device under test 14 by way of the probe pins 26.

There are a number of problems with the prior art space transformer. Aligning and soldering each individual wire 36 is time-consuming and expensive. The flatness of the mounting block 30 is impacted by both the fasteners 38 and epoxy potting compound 39. If the mounting block is offset or distorted, electrical continuity between the device under test and the circuit traces on the printed circuit board may be lost. There remains, therefore a need for a lower cost and more reliable space transformer that does not suffer from the above-named disadvantages.

BRIEF SUMMARY OF THE INVENTION

In accordance with one embodiment of the invention, there is provided a space transformer for electrically interconnecting a probe head to a printed circuit board. The space transformer has a flexible multilayer circuit with device under test contact pads formed on a first side and printed circuit board contact pads formed on a second side. Internal to the space transformer, electrically conductive circuit traces extend between the device under test contact pads and the printed circuit board contact pads. In order to mitigate the risk of wear damage, a shim plate is fastened to a periphery of the first side of the flexible multilayer circuit and a bottom plate is fastened to a periphery of the second side of the flexible multilayer circuit. For the purposes of support, this bottom plate has a plurality of internal apertures separated by bottom plate stanchions where the bottom plate stanchions are aligned with the device under test contact pads and the internal apertures are aligned with the printed circuit board contact pads. A plurality of interconnects are bonded and electrically interconnected to the printed circuit contact pads and extend through the internal apertures.

In accordance with another embodiment of the invention, there is provided a space transformer for electrically interconnecting a probe head to a printed circuit board. The space transformer includes a flexible multilayer circuit having device under test contact pads formed on a first side thereof and printed circuit board contact pads formed on a second side thereof. Electrically conductive circuit traces extend between the device under test contact pads and the printed circuit board contact pads. A top plate is fastened to a periphery of the first side of the flexible multilayer circuit. This top plate has a plurality of top plate apertures separated by top plate stanchions where the top plate stanchions are aligned with the printed circuit board contact pads and the top plate apertures are aligned with the device under test contact pads. A bottom plate is fastened to a periphery of the second side of the flexible multilayer circuit. The bottom plate has a plurality of internal apertures separated by bottom plate stanchions where the bottom plate stanchions are aligned with the device under test contact pads and the internal apertures are aligned with the printed circuit board contact pads. A plurality of interconnects are bonded and electrically interconnected to the printed circuit contact pads and extend through the internal apertures.

The details of one or more embodiments of the invention are set forth in the accompanying drawings and the description below. Other features, objects, and advantages of the invention will be apparent from the description and drawings, and from the claims.

BRIEF DESCRIPTION OF THE DRAWINGS

For the purpose of illustrating the invention, the drawings show a form of the invention that is presently preferred. However, it should be understood that the present invention is not limited to the precise arrangements and instrumentalities shown in the drawings, wherein.

DETAILED DESCRIPTION

Figure 1:
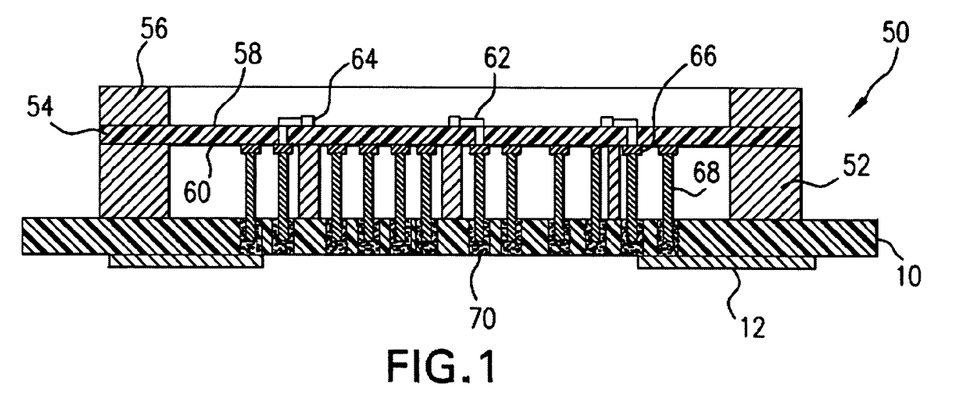
FIG. 1 shows a flexible space transformer circuit assembly in accordance with a first embodiment of the invention attached to a printed circuit board.
Figure 2:
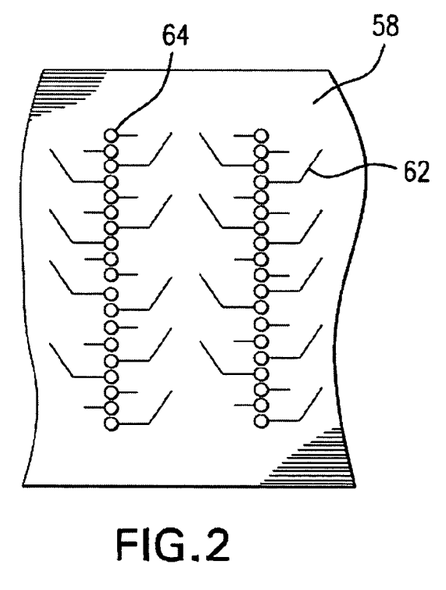
FIG. 2 shows a top plainer view of a flexible space transformer circuit used in the assembly of FIG. 1.

Referring now to the drawings in which like reference numerals indicate like parts, and in particular, to FIG. 1, the present invention is a space transformer 50, which includes in one embodiment a bottom plate 52, a flexible multilayer circuit 54, and a shim plate 56. The space transformer 50 is fastened to the printed circuit board 10 and provides electrical continuity between a device under test and external circuitry. With reference to FIGS. 1 and 2, the flexible multilayer circuit 54 has a first side 58 that faces a probe head assembly (not shown) and a second side 60 that faces the printed circuit board 10. The flexible multilayer circuit is formed from any suitable dielectric material, such as polyimide. Circuit traces 62 fan out from relatively small device under test contact pads 64. The device under test contact pads 64 align with the second end of the probe pins of the probe head assembly and if rectangular have nominal dimensions of 90 microns by 100 microns. Similarly, if the device under test contact pads 64 are circular, they have a nominal diameter of about 100 microns.

Figure 3:
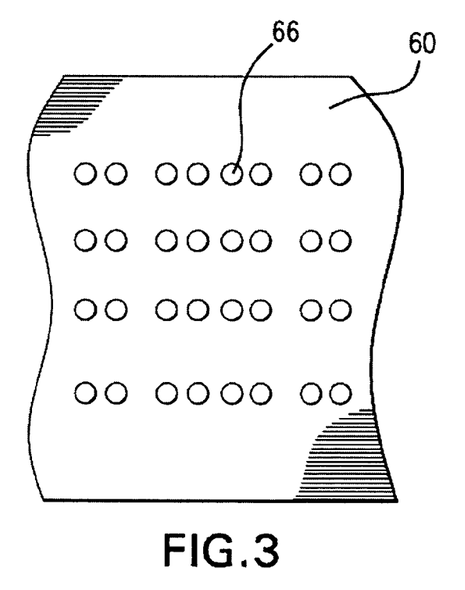
FIG. 3 shows the flexible space transformer circuit of FIG. 2 in bottom planer view.

The flexible space transformer circuit traces 62 fan out from the device under test contact pads either on the first side 58, the second side 60 or some intervening layer within the multilayer flexible space transformer circuit. With reference to FIGS. 1 and 3, the circuit traces terminate at PC board contact pads 66.

Electrically interconnected to the flexible space transformer contact pads 66 are interconnects 68 that are, in accordance with this first embodiment, in the form of electrically conductive pins. The pins 68 extend to an electrically conductive via 70 on the printed circuit board and are mechanically fastened in place and electrically interconnected by means of a solder. The solder provides electrical interconnection from the pins 68 to conductive traces 12 leading to external test equipment.

Figure 4:
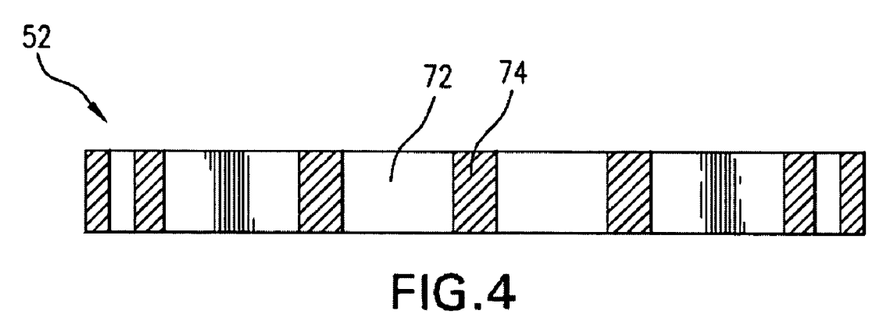
FIG. 4 shows a bottom plate in cross-sectional representation for use with the space transformer assembly of FIG. 1.
Figure 5:
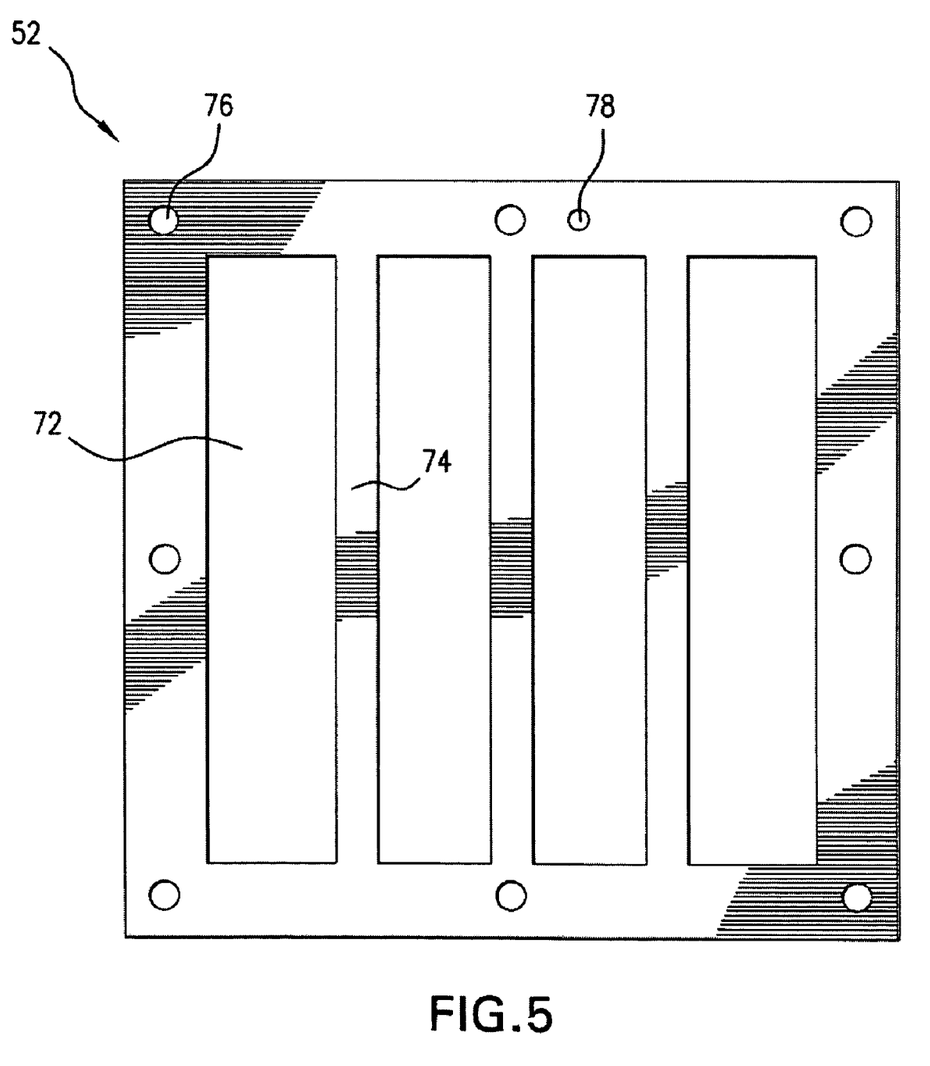
FIG. 5 shows the bottom plate of FIG. 4 in top planer view.

With reference to the FIGS. 4 and 5, the bottom plate 52 is formed from a rigid, machinable material such as an aluminum alloy or steel and has a nominal thickness of 0.15 inch. The bottom plate is a support mechanism and provides overall rigidity for the flexible multilayer circuit 54. Bottom plate 52 includes a plurality of internal apertures 72 separated by bottom plate stanchions 74. The bottom plate stanchions 74 are positioned to align with the device under test contact pads 64 to provide a rigid immovable surface when the probe pins contact the device under test contact pads. The internal apertures 72 receive the interconnect pins 68 to facilitate traversal of the interconnect pins between the flexible multilayer circuit 54 and the printed circuit board 10. As described below, mounting holes 76 align the space transformer components and timing hole 78 aligns the space transformer with the printed circuit board.

Figure 6:
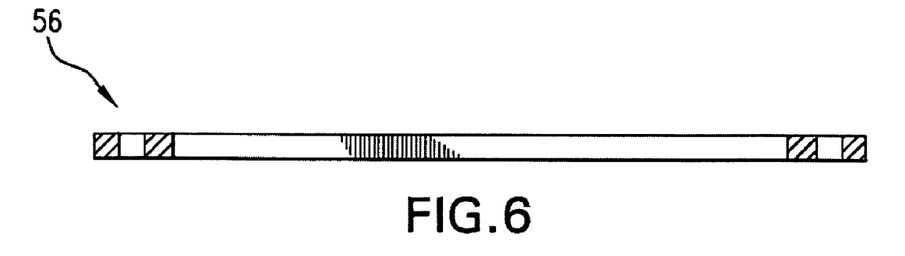
FIG. 6 shows in cross-sectional representation a shim plate for use with the space transformer assembly of FIG. 1.
Figure 7:
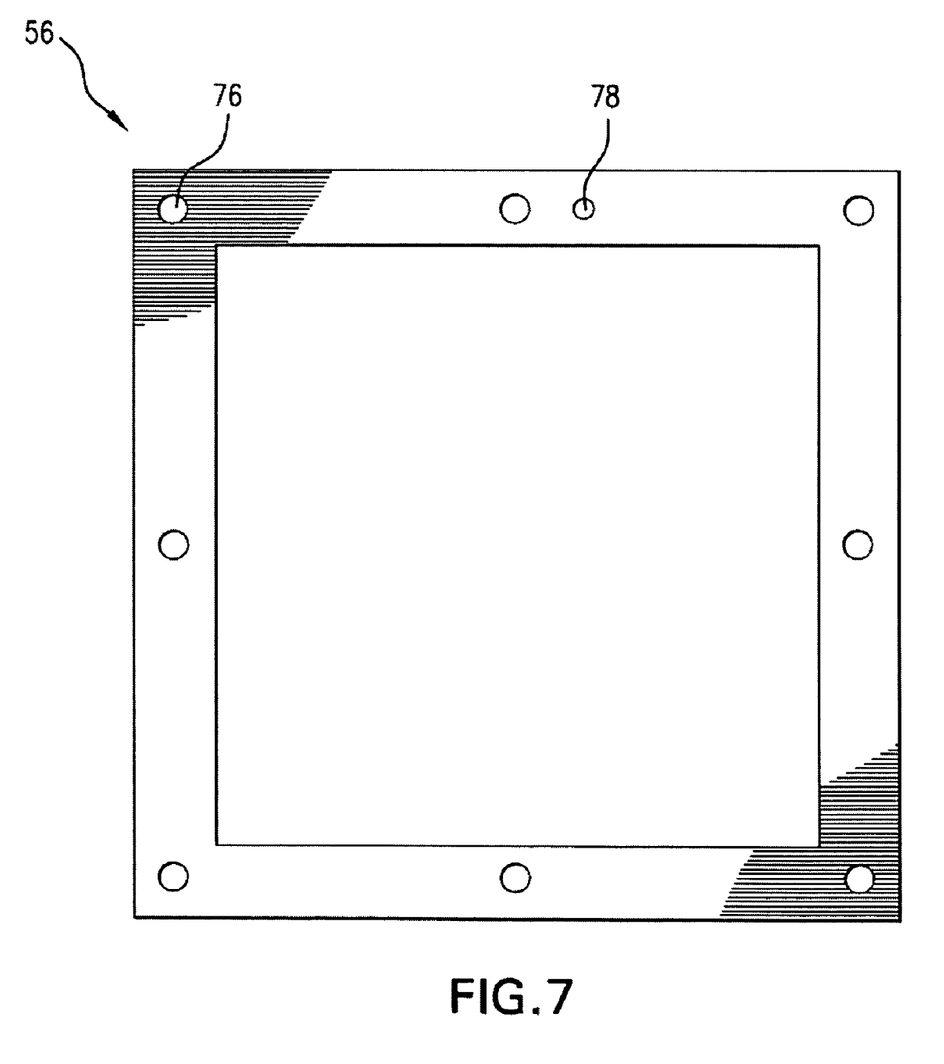
FIG. 7 shows the shim plate of FIG. 6 in top planer view.

With reference to FIGS. 6 and 7, the shim plate 56 protects the periphery of the flexible multilayer circuit from damage such as from contact with fixturing screws of the probe head. The shim plate is formed from a rigid, easily machinable material such as an aluminum alloy or steel and has a nominal thickness of 0.01 inch. The shim plate 56 includes alignment holes 76 and timing hole 78 that align with similar holes formed in the flexible multilayer circuit and the bottom plate.

Figure 8:
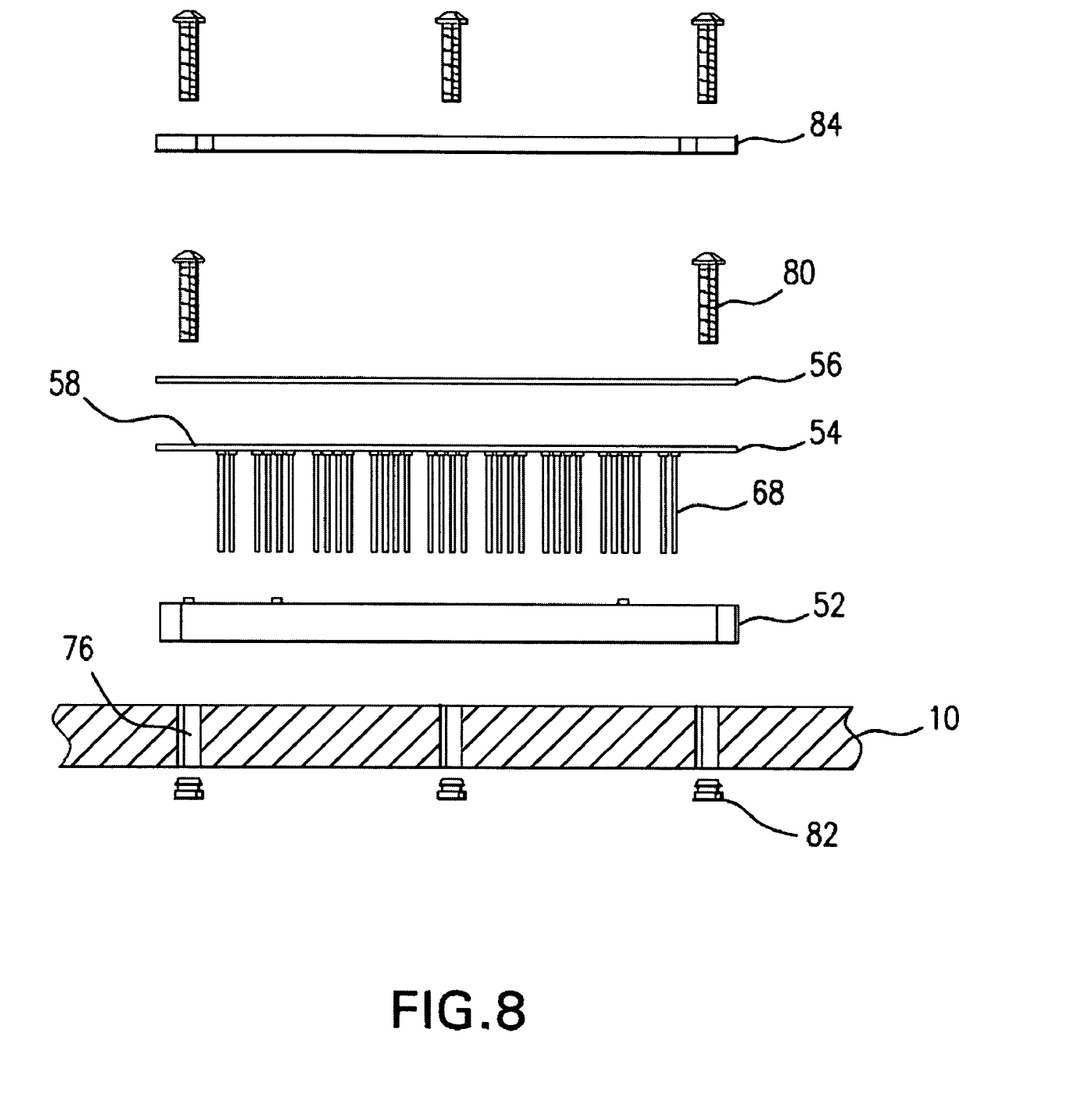
FIG. 8 illustrates a method for the assembly of the space transformer assembly of FIG. 1.

Assembly of the space transformer is illustrated in FIG. 8. Bottom plate 52, flexible multilayer circuit 54, and shim plate 56 are fastened to the printed circuit board 10 such as by bolts 80 that extend through the alignment holes 76 and are tightly secured by nuts 82. A top plate 84 is temporarily fastened to secure and flatten the first side 58 of the flexible multilayer circuit 54. Before the top plate 84 is in place, the interconnect pins 68 are soldered to the second side of the flexible multilayer circuit 54 and to conductive via mounting holes 76 in the printed circuit board 10. Following assembly of the space transformer, the top plate 84 is removed.

Figure 9:
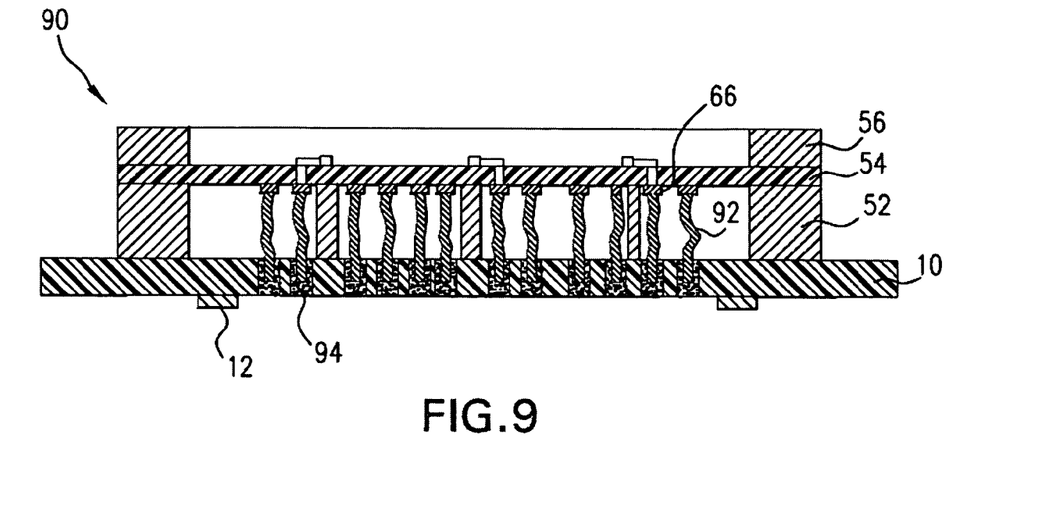
FIG. 9 shows a space transformer assembly in accordance with a second embodiment of the invention.

An alternative space transformer 90 is illustrated FIG. 9. The shim plate 56, flexible multilayer circuit 54, and bottom plate 52 are as previously described. Rather than rigid pins as interconnects, wires 92 are soldered to the flexible space transformer circuit contact pads 66 and extend through electrically conductive vias 94 and are soldered within the PCB via hole 70 and make electrical connection to conductive traces 12 on the printed circuit board 10.

Figure 10:
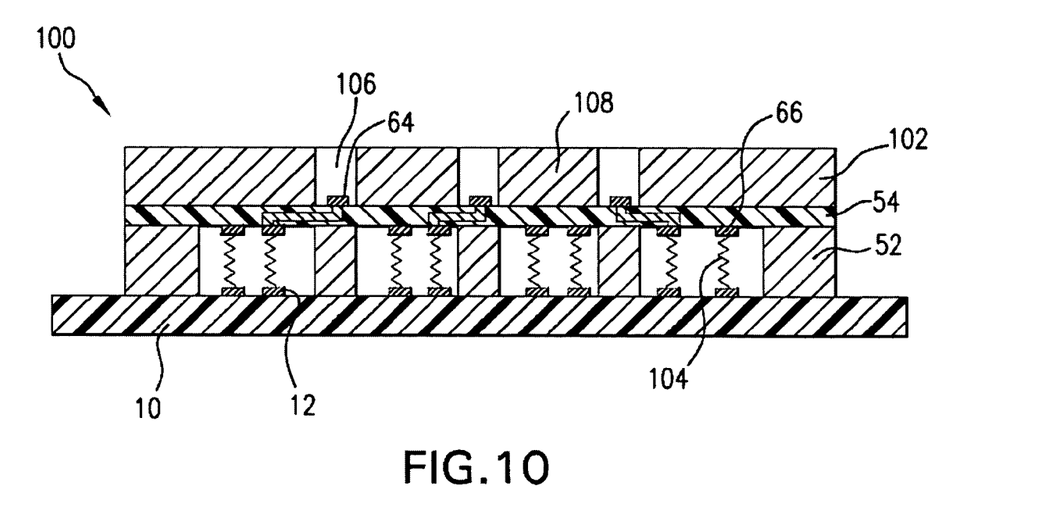
FIG. 10 shows a space transformer assembly in accordance with a third embodiment of the invention.

Yet another alternative space transformer 100 is illustrated in FIG. 10. Unlike the previous embodiments, in this embodiment, the top plate 102 has functionality and the shim plate is not required. The flexible multilayer circuit 54 and the bottom plate 52 are as previously described. Spring contacts 104 extend between the flexible space transformer circuit board contact pads 66 and the conductive traces 12 on printed circuit board 10. The conductive springs 104 are soldered to the flexible space transformer circuit board contact pad 66 and are mechanically attached by pressure to the printed circuit board traces 12. The top plate 102 has top plate apertures 106 to enable probe pins to contact the device under test contact pads 64. Top plate stanchions 108 provide a rigid backing surface such that the conductive springs 104 do not distort the flexible multilayer circuit 54.

Figure 11:
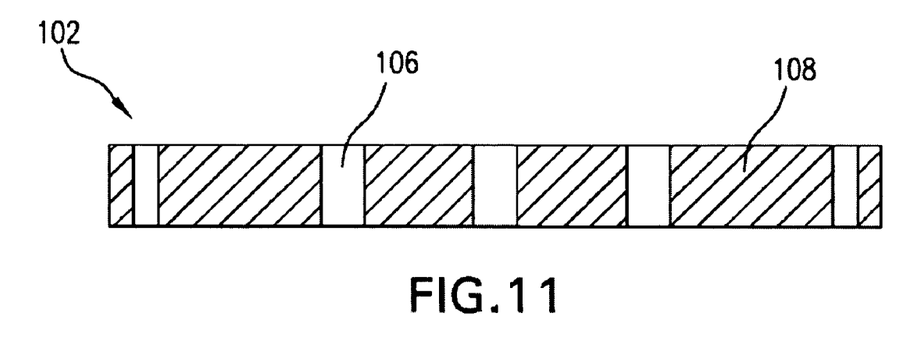
FIG. 11 shows a top plate for use with the space transformer assembly of FIG. 9 in cross-sectional representation.
Figure 12:
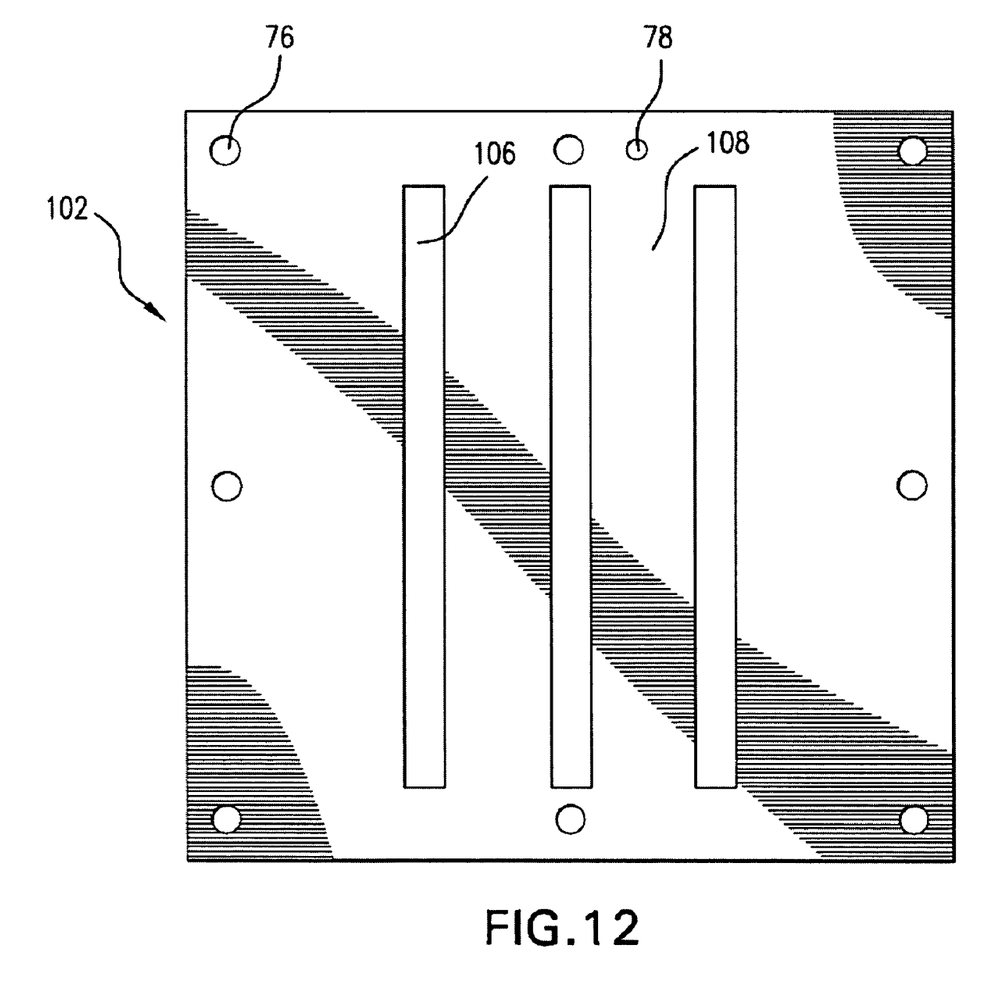
FIG. 12 shows the top plate of FIG. 11 in top planer view.

With reference to FIGS. 11 and 12, the top plate 102 is formed from a rigid, readily machine material such as an aluminum alloy or steel. The top plate has a nominal thickness of 0.05 inch. Top plate apertures 106 receive the probe pins while top plate stanchions 108 provide a rigid surface against which the conductive springs 104 are biased. Alignment holes 76 and timing hole 78 is as described above.

It is apparent that there has been provided in accordance with this invention a space transformer for use in an integrated circuit test device that fully satisfies the objects, means and advantages set forth herein above. Although the invention has been described and illustrated with respect to exemplary embodiments thereof, it should be understood by those skilled in the art that the foregoing and various other changes, omissions and additions may be made therein and thereto, without parting from the spirit and scope of the present invention.

What is claimed is:

1. A space transformer for electrically interconnecting a probe head to a printed circuit board, comprising:
   a flexible multilayer circuit having device under test contact pads formed on a first side thereof and having printed circuit board contact pads formed on a second side thereof;
   electrically conductive circuit traces extending between said device under test contact pads and said printed circuit board contact pads;
   a shim plate fastened to a periphery of said first side of said flexible multilayer circuit;
   a bottom plate fastened to a periphery of said second side of said flexible multilayer circuit, said bottom plate having a plurality of internal apertures separated by bottom plate stanchions where said bottom plate stanchions are aligned with said device under test contact pads and said internal apertures are aligned with said printed circuit board contact pads; and
   a plurality of interconnects bonded to and electrically interconnected with said printed circuit board contact pads and extending through said internal apertures.

2. A space transformer according to claim 1 wherein said interconnects are rigid, electrically conductive pins soldered to said printed circuit board contact pads.

3. A space transformer according to claim 2 wherein said interconnects are adapted to be soldered to electrically conductive vias of the printed circuit board.

4. A space transformer according to claim 1 wherein said interconnects are flexible wires soldered to said printed circuit board contact pads.

5. A space transformer according to claim 4 wherein said interconnects are adapted to be soldered to electrically conductive vias of the printed circuit board.

6. A space transformer for electrically interconnecting a probe head to a printed circuit board, comprising:
   a flexible multilayer circuit having device under test contact pads formed on a first side thereof and having printed circuit board contact pads formed on a second side thereof
   electrically conductive circuit traces extending between said device under test contact pads and said printed circuit board contact pads;
   a top plate fastened to a periphery of said first side of said flexible multilayer circuit, said top plate having a plurality of top plate apertures separated by top plate stanchions where said top plate stanchions are aligned with said printed circuit board contact pads and said top plate apertures are aligned with said device under test contact pads;
   a bottom plate fastened to a periphery of said second side of said flexible multilayer circuit, said bottom plate having a plurality of internal apertures separated by bottom plate stanchions where said bottom plate stanchions are aligned with said device under test contact pads and said internal apertures are aligned with said printed circuit board contact pads; and
   a plurality of interconnects bonded to and electrically interconnected with said printed circuit contact pads and extending through said internal apertures.

7. A space transformer according to claim 6 wherein said interconnects are electrically conductive compression springs soldered to said printed circuit boards contact pads.

8. A space transformer according to claim 7 wherein said compression springs are adapted to be compressed between said top plate stanchions and circuit traces on the printed circuit board.

9. A space transformer for electrically interconnecting a probe head to a printed circuit board, comprising:
   a flexible multilayer circuit having device under test contact pads formed on a first side thereof and having printed circuit board contact pads formed on a second side thereof; means for electrically connecting said device under test contact pads and said printed circuit board contact pads;
   a shim plate fastened to a periphery of said first side of said flexible multilayer circuit;
   a bottom plate fastened to a periphery of said second side of said flexible multilayer circuit, said bottom plate having a plurality of internal apertures separated by bottom plate stanchions where said bottom plate stanchions are aligned with said device under test contact pads and said internal apertures are aligned with said printed circuit board contact pads; and
   means for electrically connecting said printed circuit board contact pads with the printed circuit board.

10. A space transformer according to claim 9 wherein said means for electrically connecting said device under test contact pads and said printed circuit board contact pads includes electrically conductive circuit traces extending between said device under test contact pads and said printed circuit board contact pads.

11. A space transformer according to claim 9 wherein said means for electrically connecting said printed circuit board contact pads with the printed circuit board includes interconnects, which are rigid, electrically conductive pins soldered to said printed circuit board contact pads.

12. A space transformer according to claim 11 wherein said interconnects are adapted to be soldered to electrically conductive vias of the printed circuit board.

13. A space transformer according to claim 11 wherein said interconnects are flexible wires soldered to said printed circuit board contact pads.

14. A space transformer according to claim 13 wherein said interconnects are adapted to be soldered to electrically conductive vias of the printed circuit board.

* * * * *